United States Patent
Moosa et al.

(10) Patent No.: US 7,612,619 B2
(45) Date of Patent: Nov. 3, 2009

(54) PHASE DETECTOR DEVICE AND METHOD THEREOF

(75) Inventors: Mohamed S. Moosa, Round Rock, TX (US); Leo Mathew, Austin, TX (US); Sriram S. Kalpat, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 762 days.

(21) Appl. No.: 11/387,595

(22) Filed: Mar. 23, 2006

(65) Prior Publication Data

US 2007/0223636 A1    Sep. 27, 2007

(51) Int. Cl.
*H03L 7/00* (2006.01)
(52) U.S. Cl. ............... 331/25; 331/108 C; 257/250; 438/286; 438/275
(58) Field of Classification Search .......... 438/268, 438/275; 257/250; 331/25, 108 C
See application file for complete search history.

(56) References Cited

U.S. PATENT DOCUMENTS 6,969,656 B2 * 11/2005 Du et al. ............... 438/268

7,279,997 B2 * 10/2007 Kalpat et al. ............ 331/57

OTHER PUBLICATIONS

Centurelli et al., "A High-Speed Low-Voltage Phase Detector for Clock Recovery from NRZ Data," ISCAS 2004, IEEE, STMicroelectronics, Cornaredo, Italy, pp. IV-297-IV-300, 2004.
Soliman et al., "An Overview of Design Techniques for CMOS Phase Detectors," 2002 IEEE, Ontario, Canada, pp. V-457-V-460, 2002.

* cited by examiner

*Primary Examiner*—Arnold Kinkead

(57) ABSTRACT

A device and method for phase detection are disclosed. The device includes a phase differential module that provides a phase difference signal based on the phase difference between a data signal and a reference signal. The phase difference signal is provided to a first gate of a multi-gate fin-type field effect transistor (multi-gate FinFET) of the device. A second gate of the multi-gate FinFET transistor receives a bias signal that provides a phase detection threshold. A phase adjustment signal is provided at one or both of the FinFET current electrodes based on the phase difference signal and the bias signal.

20 Claims, 3 Drawing Sheets

US 7,612,619 B2

PHASE DETECTOR DEVICE AND METHOD THEREOF

FIELD OF THE DISCLOSURE

The present disclosure relates to devices having phase detection compensation, and more particularly to devices having transistor-based phase detection.

BACKGROUND

Detection of phase differences between signals is desirable in many applications, such as applications using phase locked loops (PLLs) for clock and data recovery in digital systems, carrier and signal detection, or synthesis in communication systems. Accordingly, accurate and sensitive measurement of phase differences can be useful in phase detection devices. Phase detection devices, however, can demand complex circuit topologies, requiring many components. Such complexity can be problematic in phase detection devices implemented in integrated circuits, where process variations in forming the integrated circuits can lead to variation in the performance of the individual components used in the phase detection device. This can reduce the accuracy and the sensitivity of the phase detector.

Therefore, it is desirable to provide an improved phase detection device.

DESCRIPTION OF THE DRAWINGS

A device and method for phase detection are disclosed. The device includes a phase differential module that provides a phase difference signal based on the phase difference between a data signal and a reference signal. The phase difference signal is provided to a first gate of a multi-gate fin-type field effect transistor (multi-gate FinFET) of the device. A second gate of the multi-gate FinFET transistor receives a bias signal that provides a phase detection threshold. A phase indicator signal is provided at one or both of the FinFET current electrodes based on the phase difference signal and the bias signal. Specific embodiments of the present disclosure will be better understood with respect to the figures.

Figure 1:
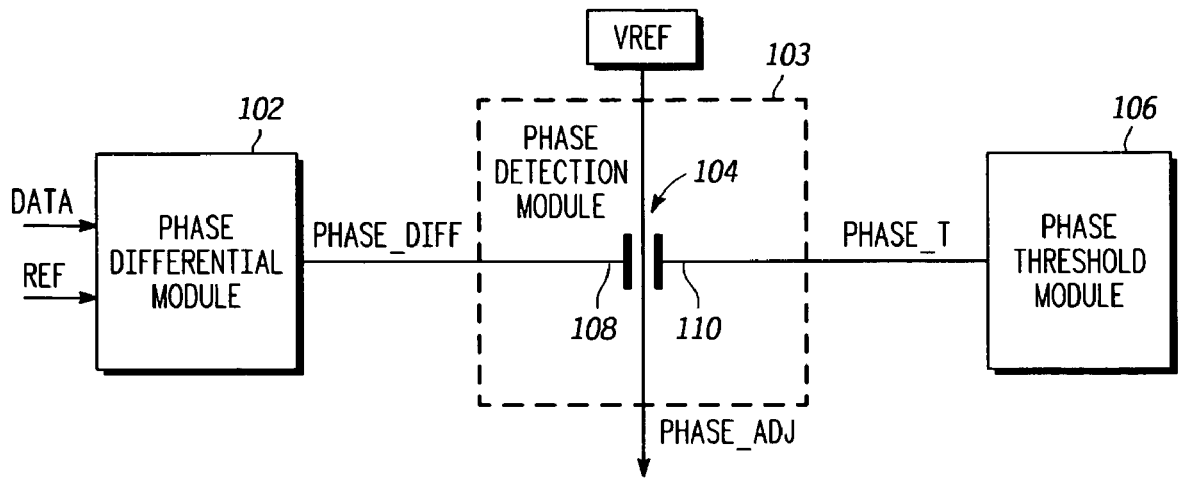
FIG. 1 is a block diagram of a particular embodiment of a phase detection device.

Referring to FIG. 1, a block diagram of a particular embodiment of a phase detection device 100 is illustrated. The phase detection device 100 includes a phase differential module 102 having a first input to receive a signal labeled "DATA", a second input to receive a signal labeled "REF" and an output to provide an output signal labeled "PHASE_D-IFF." In a particular embodiment, the signal PHASE_DIFF is a phase difference signal representing a phase difference between the signal DATA and the signal REF. In a particular embodiment, the signal REF represents a reference signal having a first phase that is fixed, and the DATA signal is a data signal having a phase that can vary. The phase detection device 100 also includes a phase threshold module 106 having an output to provide a phase threshold signal labeled "PHASE_T." The PHASE_T signal provides a bias voltage representative of a phase detection threshold. The phase detection device 100 further includes a phase detection module 103 having a first input connected to the output of the phase differential module 102, a second input connected to the output of the phase threshold module 106, and an output to provide a phase indicator signal as labeled "PHASE_ADJ." Because phase indicator signals are typically used to adjust the phase of the signal DATA, they are also referred to herein as phase adjustment signals. The phase detection module 103 includes a multi-gate FinFET 104 having a first gate electrode 108 connected to the first input of the phase detection module 103 and a second gate electrode 110 connected to the second input of the phase detection module 103. The multi-gate FinFET 104 also includes a current electrode connected to the output of the phase detection module 103, and a current electrode connected to a voltage reference node labeled VREF.

During operation, the phase differential module 102 provides to the phase detection module 103 the signal PHASE_DIFF, which is representative of the difference in phase between the data signal DATA and the reference signal REF, and the phase threshold module 106 provides the signal PHASE_T.

The signal PHASE_DIFF is applied to the first gate electrode 108 of the multi-gate FinFET 104. The signal PHASE_T is applied to the second gate electrode 110 of the multi-gate FinFET 104 to set a bias level for the multi-gate FinFET 104. The signal PHASE_T is representative of a phase detection threshold in that its value can affect how the multi-gate FinFET 104 responds to the signal PHASE_DIFF. Accordingly, the phase adjustment signal PHASE_ADJ is based on a relationship between the PHASE_DIFF signal and the PHASE_T threshold signal. In particular, when the PHASE_DIFF signal exceeds the bias level set by the signal PHASE_T, current is allowed to flow through the current electrode, thereby adjusting the signal PHASE_ADJ to be indicative of a phase differential. It will be appreciated that the bias level for the multi-gate FinFet 104 is based not only on a voltage of the signal PHASE_T, but also on the characteristics of the multi-gate FinFet 104 For example, in a particular embodiment, the multi-gate FinFet 104 can have an inherent bias level of 0.5 volts at which the signal PHASE_D-IFF begins to turn on the FinFET 104. However, application of a voltage of −1.2 volts at the second gate electrode 110 from the signal PHASE_T will set the bias level of the multi-gate FinFet 104 to 1.7 volts with respect to the signal PHASE_DIFF to be higher, for example approximately 1-7 volts.

Further, the phase threshold module 106 can change the voltage level of signal PHASE_T over time, thereby changing the bias level of the multi-gate FinFET 104, and therefore changing the sensitivity of the phase detection module to phase differences. This can be useful if the device 100 requires a variable sensitivity of phase detection based on an application. Further, by iteratively changing the voltage level of PHASE_T over time, the signal PHASE_T can be used to determine a digital representation of the phase difference between the DATA and REF signals.

In addition, the PHASE_ADJ signal can be used in a feedback loop to adjust the phase of the DATA signal. For example, the PHASE_ADJ signal can be applied to a phase locked loop module (not illustrated). When the PHASE_ADJ signal indicates that the DATA signal does not have the same phase as the REF signal, the phase locked loop can adjust the phase of the signal DATA.

It will be appreciated that the use of a multi-gate FinFET for phase detection allows the phase detection module 103 to consume a relatively small space in an integrated circuit.

Figure 2:
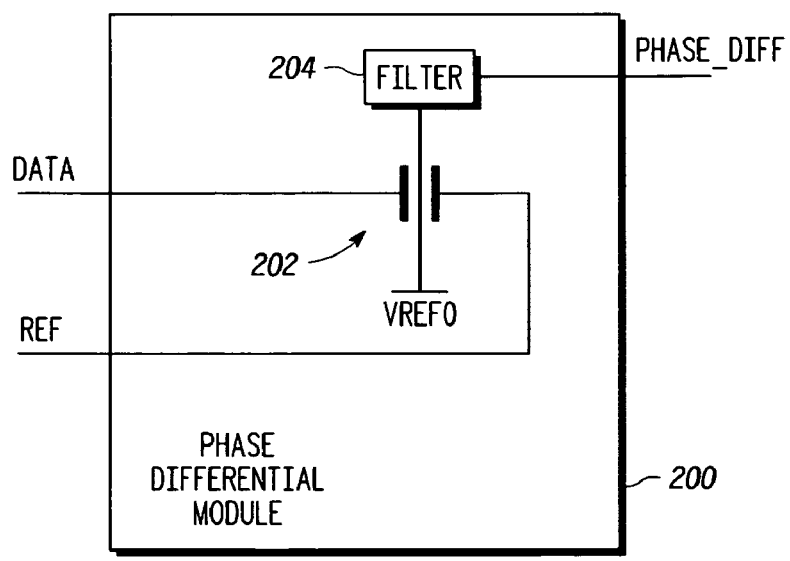
FIG. 2 is a block diagram of a particular embodiment of a phase differential module.

Referring to FIG. 2, a particular embodiment of a phase differential module 200 is illustrated. The phase differential module 200 includes inputs and outputs similar to the phase differential module 102 of FIG. 1. In addition, the phase differential module 200 includes a multi-gate FinFET 202 having a first gate electrode to receive the signal DATA. The multi-gate FinFET 202 also includes a second gate electrode to receive the REF signal. The multi-gate FinFET 202 also has a current electrode connected to filter 204 from which the signal PHASE_DIFF is provided. Further, a current electrode is connected to a voltage reference node labeled VREF0.

During operation, the signal REF biases the first gate electrode 208 while the signal DATA biases the second gate electrode of FinFET 202. In a particular embodiment, the REF signal and the DATA signal are AC signals. Accordingly, multi-gate FinFET 202 operation varies over time based upon the variation between the REF signal and the DATA signal. Specifically, the current flow through FinFET 202 is based upon the relationship of a voltage at the first gate electrode and the gate electrode 208. In a particular embodiment, the current may be expressed according to the following formula:

$$C = \frac{AB}{2}[\cos(\phi) - \cos(2\omega t + \phi)]$$

where A and B are the maximum amplitudes of the DATA and REF signals, and $\phi$ is the phase difference between the signals. It will be appreciated that the above formula includes a DC term and a double-frequency term. The filter 204 can filter the current at the current electrode 210 so that the signal PHASE_DIFF is based on only the DC term. Accordingly, in a particular embodiment, the signal PHASE_DIFF may be expressed according to the following formula:

$$\text{PHASE\_DIFF} = \frac{AB}{2}\cos(\phi)$$

Thus, the signal PHASE_DIFF will depend on the phase relationship between the DATA and REF signals.

One of skill in the art will appreciate that, in an integrated circuit, the multi-gate FinFET can be formed so that its first gate electrode and the second gate electrode are closely matched. This allows the multi-gate FinFET 202 to accurately detect variations between the DATA and REF signals. Accordingly, the phase differential module 200 can be employed in phase detectors requiring accuracy and sensitivity.

Figure 3:
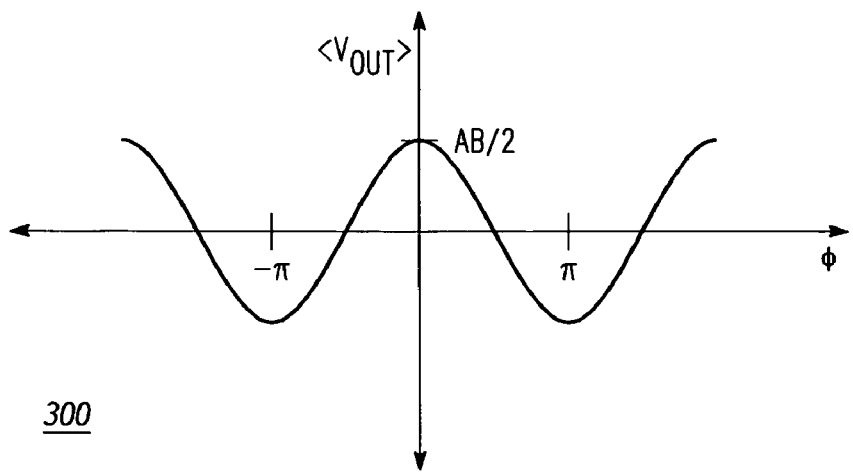
FIG. 3 is a diagram of a particular embodiment of a wave form representing the behavior of the phase differential module of FIG. 2.

Referring to FIG. 3, a diagram of the behavior of the phase differential module 200 under a specific set of conditions is illustrated. The diagram 300 illustrates the behavior of the phase differential module 200 when the reference signal REF and the signal DATA are sinusoidal signals. In the illustrated particular embodiment, the y-axis represents the average DC output of the phase differential module 200, and the x-axis represents the phase difference between the signal DATA and the signal REF. As illustrated, the average output of the phase differential module 200 varies along an approximately sinusoidal wave according to the phase difference between the signals.

Therefore, as illustrated by FIG. 3, the magnitude of the current at the current electrode 210 will vary according to the difference in phase between the DATA and REF signals. In the illustrated embodiment, the average voltage of the current will be minimized, e.g. have the smallest magnitude, when the DATA and REF signals are 90 degrees out of phase, and maximized when the signals are in phase or 180 degrees out of phase. In a particular embodiment, the curve illustrated in FIG. 3 can be shifted so that the average voltage of the current is minimized when the DATA and REF signals are in phase or 180 degrees out of phase.

Figure 4:
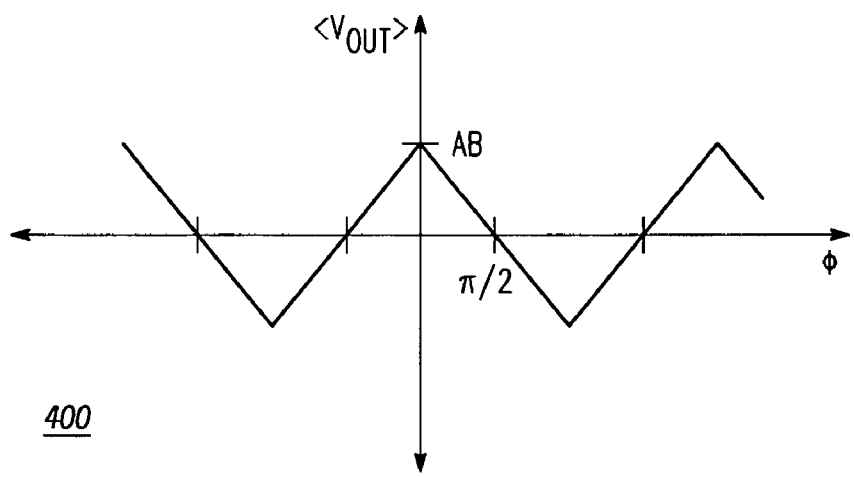
FIG. 4 is a diagram of another particular embodiment of the behavior of the phase differential module of FIG. 2.

Referring to FIG. 4, a diagram of another particular embodiment of the behavior of the phase differential module 200 is illustrated. The diagram 400 illustrates the behavior of the phase differential module 200 when the reference signal REF and the signal DATA are approximately square wave signals. As illustrated, the average output of the phase differential module 200 varies along an approximately sawtooth wave according to the phase difference between the signals.

Figure 5:
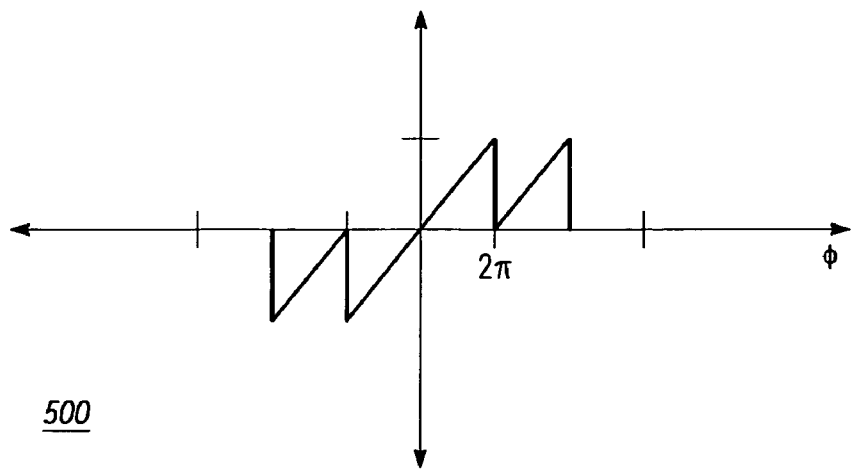
FIG. 5 is a diagram of yet another particular embodiment of a wave form representing the behavior of the phase differential module of FIG. 2.

Referring to FIG. 5, a diagram of another particular embodiment of the behavior of the phase differential module 200 is illustrated. The diagram 400 illustrates the behavior of the phase differential module 200 when the phase differential module is used as an extended phase differential module. When used as an extended phase differential module, the output of the phase differential module 200 has a phase difference detection range of more than one period. That is, the phase differential module is able to detect phase differences greater than 360 degrees. As illustrated in diagram 400, the average output of the phase differential module 200 varies over more than 360 degrees (2Π).

Figure 6:
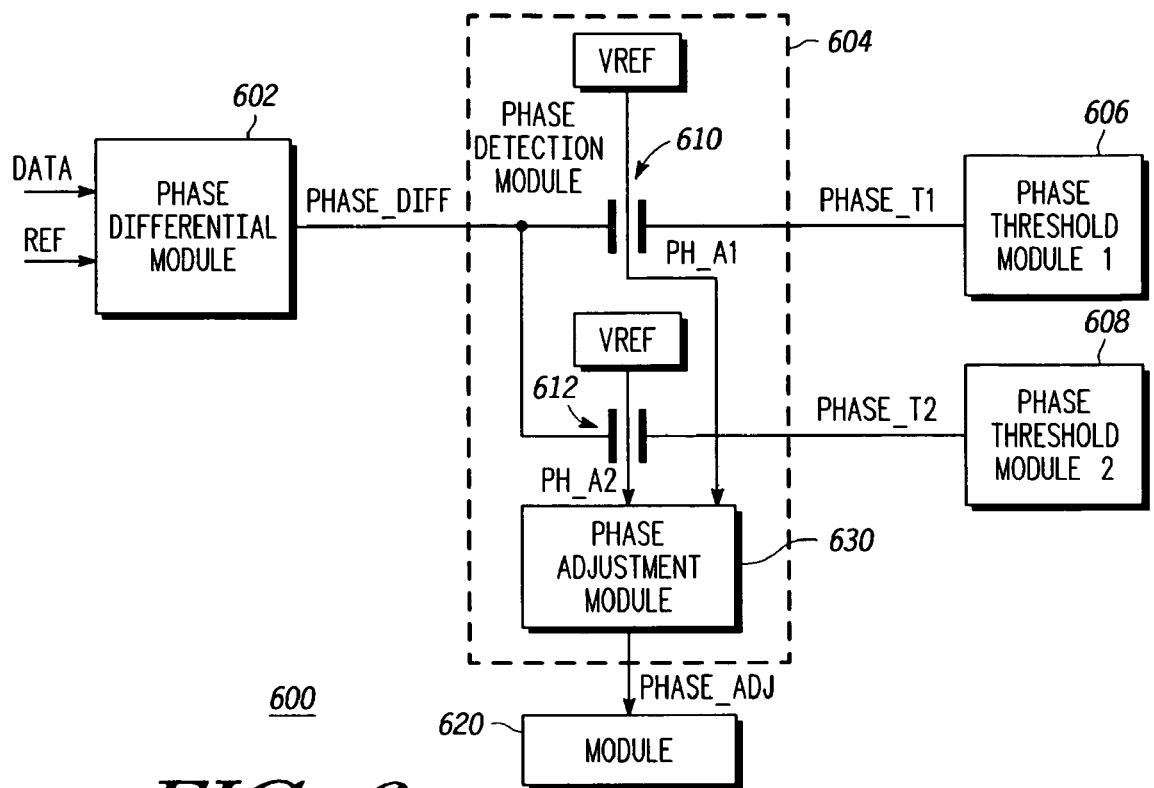
FIG. 6 is a block diagram of an alternative embodiment of a phase detection device.

Referring to FIG. 6, a particular embodiment of a phase detection device 600 is illustrated. The phase detection device 600 includes a phase differential module 602 having a first input to receive a data signal labeled DATA, a second input to receive a reference signal labeled REF and an output to provide an output signal labeled PHASE_DIFF. The phase detection device 600 also includes a first phase threshold module 606 having an output to provide a phase threshold signal labeled PHASE_T1 and a second phase threshold module 608 having an output to provide a phase threshold signal labeled PHASE_T2.

In addition, the phase detection device 600 includes a phase detection module 604 having a first input to receive the signal PHASE_DIFF, a second input to receive the signal PHASE_T1, a third input to receive the signal PHASE_T2, and an output to provide a phase adjustment signal labeled "PHASE_ADJ." The phase detection device 600 also includes a module 620 including an input connected to the output of the phase detection module 604. The module 620 may be a phase locked loop, a phase shift keying module, or other appropriate module.

The phase detection module 604 includes a first multi-gate FinFET 610 having a first gate electrode connected to the first input of the phase detection module 604 and a second gate electrode connected to the second input of the phase detection module 604. In addition, the first multi-gate FinFET 610 has a first current electrode to provide a phase adjustment signal labeled PH_A1 and a second current electrode connected to a voltage reference VREF. The phase detection module 604 also includes a second multi-gate FinFET 612 having a first gate electrode connected to the first input of the phase detection module 604 and a second gate electrode connected to the third input of the phase detection module 604. In addition, the second multi-gate FinFET 612 has a first current electrode to provide a phase adjustment signal labeled PH_A2 and a second current electrode connected to the voltage reference VREF. The phase detection module 604 also includes a phase adjustment module 630 having a first input connected to the current electrode of the first multi-gate FinFET 610, a second input connected to the current electrode of the second multi-gate FinFET 612, and an output connected to the output of the phased detection module 604.

During operation, the first and second threshold modules 606 and 608 apply phase threshold signals to bias the first and second multi-gate FinFETs 610 and 612, respectively. The bias signals PHASE_T1 and PHASE_T2 are representative of different phase detection thresholds. In addition, the phase differential module 602 provides the signal PHASE_DIFF, representative of the difference in the phases of the DATA and REF signals, to the multi-gate FinFETs 610 and 612, respectively. Accordingly, the signals PH_A1 and PH_A2 are based on the respective relationship between the phase threshold signals PHASE_T1 and PHASE_T2 and the signal PHASE_DIFF.

The threshold levels of the first phase threshold module 606 and second phase threshold module 608 may be set so that the adjustment signals PH_A1 and PH_A2 are related to the magnitude of the difference in phase between the DATA and REF signals. For example, the threshold level of the first phase threshold module 606 may be set so that the signal PH_A1 is asserted when there is a relatively small difference in the phase of the DATA and REF signals. In contrast, the threshold level of the second phase threshold module 608 may be set so that the signal PH_A2 is asserted when the difference in phase of the DATA and REF signals is relatively large.

Accordingly, the signals PH_A1 and PH_A2 together provide a digital representation of the phase difference between the DATA and REF signals. This digital representation may be used in a variety of ways, including to adjust the phase of the DATA signal.

The phase adjustment module 630 receives the phase adjustment signals PH_A1 and PH_A2 and produces a third phase adjustment signal, PHASE_ADJ, based on these signals. If the phase adjustment signals PH_A1 and PH_A2 are each representative of different magnitudes in phase difference, the magnitude of the signal PHASE_ADJ can be adjusted accordingly. For example, the magnitude of the signal PHASE_ADJ can be based on which of the phase adjustment signals are asserted. Accordingly, in the illustrated configuration, multiple phase threshold modules may be employed to provide better control over the detection and adjustment of the phase of the signal DATA.

Figure 7:
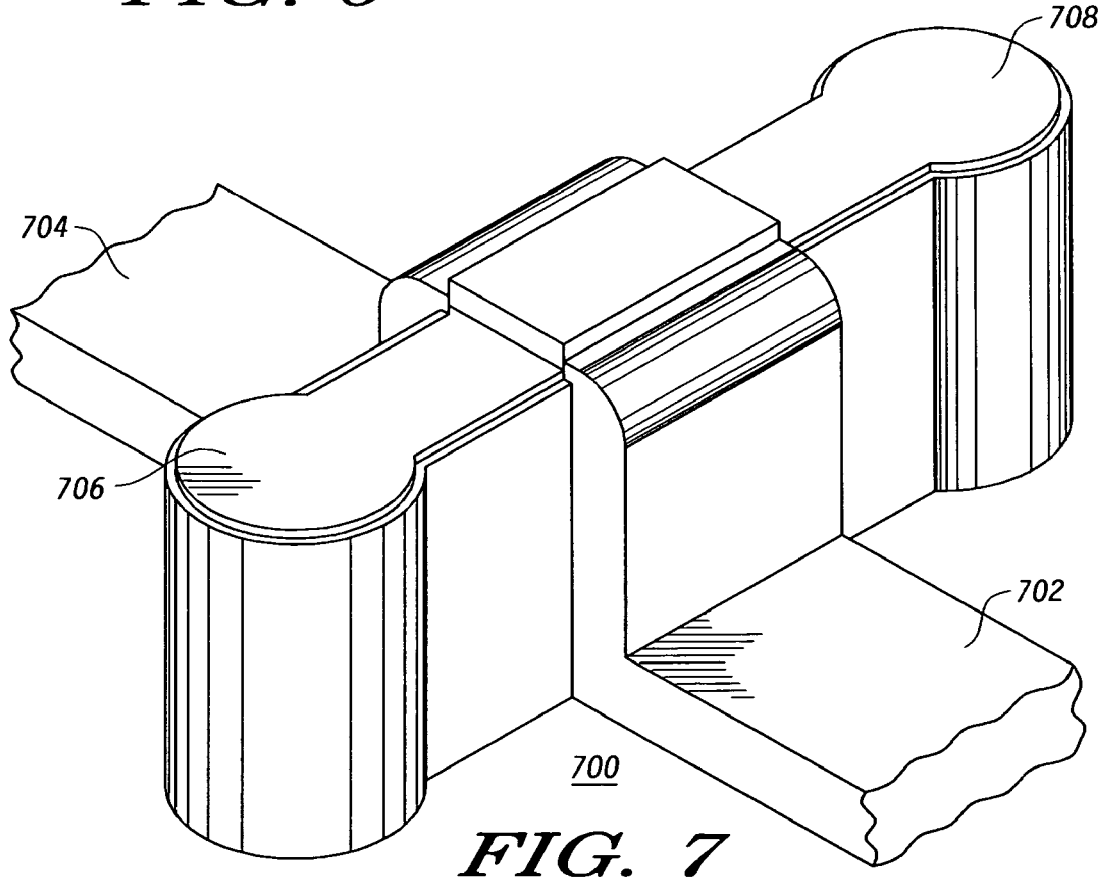
FIG. 7 is a diagram of a particular embodiment of a multi-gate FinFET transistor

Referring to FIG. 7, a particular embodiment of a multi-gate FinFET transistor 700 is illustrated. The multi-gate FinFET transistor 700 includes a first gate electrode 702, and a second gate electrode 704, and a fin structure having source/drain regions 706 and 708, and a channel region between the source/drain regions. The first gate electrode 702 overlies a first channel region at one side of a fin structure, while the second gate electrode 704 overlies a second channel region at an opposing side of the fin structure.

During operation, a bias signal may be applied at the first gate electrode 702. In response, carriers are attracted to the first channel region underlying the first gate electrode 702 and can result in current flowing between the source region 706 and the drain region 708. Depending on a value of the bias signal, no substantial current need flow from the source region 706 to the drain region 708. However, even when no substantial current flows, the bias signal can affect the operation of the transistor with respect to control signals received at gate 702.

A device and method for phase detection are disclosed. In a particular embodiment, the device includes a phase differential module including a first input to receive a first signal having a first phase, a second input to receive a reference signal having a second phase, and an output to provide a phase difference signal based on a difference between the first phase and the second phase, and a phase detection module including a first multi-gate FinFET having a first gate electrode coupled to the output of the phase differential module, a second gate electrode coupled to coupled to receive a first phase threshold signal, a first current electrode to provide a first phase indicator signal, and a second current electrode.

In one aspect, the device includes a phase threshold module comprising a first output coupled to the second gate electrode of the first multi-gate FinFET to provide the first phase threshold signal.

In another aspect, the phase differential module includes a second multi-gate FinFET comprising a first gate electrode, a second gate electrode, a first current electrode and a second current electrode, wherein the first input of the phase differential module comprises the first gate electrode, the second input of the phase differential module comprises the second gate electrode, and wherein the phase difference signal is based upon a signal at the first current electrode.

In another particular aspect, the phase differential module further includes a filter comprising an input coupled to the first current electrode of the second multi-gate FinFET.

In still another particular aspect, the phase detection module includes a third input to receive a second threshold signal and a second multi-gate FinFET comprising a first gate electrode coupled to the output of the phase differential module, a second gate electrode to receive a second phase threshold signal, a first current electrode to provide a second phase indicator signal, and a second current electrode.

In a particular aspect, the phase detection module includes a phase adjustment module comprising a first input coupled to the first current electrode of the first multi-gate FinFET, a second input coupled to the first current electrode of the second multi-gate FinFET, and an output to proved a third phase indicator signal based on the first phase indicator signal and the second phase indicator signal.

In another particular aspect, the device includes a phase locked loop comprising a first input coupled to the first current electrode of the first multi-gate FinFET to receive the first phase indicator signal.

In a particular embodiment, the method includes receiving a first phase difference signal at a first gate electrode of a first multi-gate FinFET, the first phase difference signal based on a difference between a phase of a first signal and a phase of a second signal at a first time, receiving a first bias signal at a second gate electrode of the first multi-gate FinFET, the first bias signal representative of a first phase detection threshold, and providing a first phase indicator signal at a current electrode of the first multi-gate FinFET based on the first phase difference signal and the first bias signal.

In a particular aspect, the method includes receiving a second phase difference signal at the first gate electrode of the first multi-gate FinFET, the second phase difference signal based on a difference between a phase of the first signal and a phase of the second signal at a second time, and providing a second phase indicator signal at the current electrode of the first multi-gate FinFET based on the second phase difference signal and the first bias signal.

In another particular aspect, the method includes receiving the first phase difference signal at a first gate electrode of a second multi-gate FinFET, receiving a second bias signal at a second gate electrode of the second multi-gate FinFET, the second bias signal representative of a second phase detection threshold, providing a second phase indicator signal at a current electrode of the second multi-gate FinFET based on a second phase difference signal and the second bias signal.

In still another particular aspect, the method includes providing a third phase indicator signal based on the first phase indicator signal and the second phase indicator signal. In a particular aspect, the first phase indicator signal and the second phase indicator signal provide a digital representation of the difference between the phase of the first signal and the phase of the second signal at the first time. In another particular aspect, a magnitude of the third phase indicator signal is based on a level of the first phase indicator signal and a level of the second phase indicator signal.

In a particular aspect, the method includes receiving a second bias signal at the second gate electrode of the first multi-gate FinFET, the second bias signal representative of a second phase detection threshold, and providing a second phase indicator signal at the current electrode of the first multi-gate FinFET based on the first phase difference signal and the second bias signal.

In a particular embodiment the device includes a phase threshold module having a first output to provide a first bias signal, and a first multi-gate FinFET having a first gate electrode coupled to the first output of the phase threshold module, a second gate electrode coupled to receive a phase difference signal, wherein the phase difference signal is representative of a difference in a phase of a data signal and a phase of a reference signal, and a current electrode to provide a first phase indicator signal.

In a particular aspect, the device includes a second multi-gate FinFET having a first gate electrode coupled to receive the data signal, a second gate electrode coupled to receive the reference signal, and a current electrode coupled to the second gate electrode of the first multi-gate FinFET.

In another particular aspect, the device includes a filter coupled to the second gate electrode of the second multi-gate FinFET.

In yet another particular aspect, the phase threshold module includes a second output to provide a second bias signal, and the device includes a second multi-gate FinFET having a first gate electrode coupled to the second output of the phase threshold module, a second gate electrode coupled to receive the phase difference signal, wherein the phase difference signal is representative of a difference in a phase of a data signal and a phase of a reference signal, and a current electrode coupled to provide a second phase indicator signal.

In a particular aspect, the device includes a phase adjustment module having a first input coupled to the current electrode of the first multi-gate FinFET, a second input coupled to the current electrode of the second multi-gate FinFET, and an output to provide a third phase indicator signal to adjust a phase of the data signal, the third phase indicator signal based on the first phase indicator signal and the second phase indicator signal.

In another particular aspect, the device includes a phase shift keying module comprising an input coupled to the current electrode of the first multi-gate FinFET.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all of the claims. For example, the use of multiple phase threshold modules to determine a phase difference has been illustrated. It will be appreciated that, in an alternative embodiment, the phase detection threshold for a multi-gate FinFET can be set by setting the dimensions of the FinFET. For example, the width and length of the each multi-gate FinFET may be designed to determine the detection threshold for each FinFET. This allows a large number of phase detectors to be integrated onto a small area with accurate phase detection capability. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A device, comprising:
    a phase differential module comprising a first input to receive a first signal having a first phase, a second input to receive a reference signal having a second phase, and an output to provide a phase difference signal based on a difference between the first phase and the second phase; and
    a phase detection module comprising
        a first multi-gate FinFET comprising a first gate electrode coupled to the output of the phase differential module, a second gate electrode coupled to receive a first phase threshold signal, a first current electrode to provide a first phase indicator signal, and a second current electrode.

2. The device of claim 1, further comprising:
    a phase threshold module comprising a first output coupled to the second gate electrode of the first multi-gate FinFET to provide the first phase threshold signal.

3. The device of claim 1, wherein the phase differential module further comprises:
    a second multi-gate FinFET comprising a first gate electrode, a second gate electrode, a first current electrode and a second current electrode, wherein the first input of the phase differential module comprises the first gate electrode, the second input of the phase differential module comprises the second gate electrode, and wherein the phase difference signal is based upon a signal at the first current electrode.

4. The device of claim 3, wherein the phase differential module further includes a filter comprising an input coupled to the first current electrode of the second multi-gate FinFET.

5. The device of claim 1, wherein the phase detection module further comprises:
    a third input to receive a second threshold signal; and
    a second multi-gate FinFET comprising a first gate electrode coupled to the output of the phase differential module, a second gate electrode to receive a second phase threshold signal, a first current electrode to provide a second phase indicator signal, and a second current electrode.

6. The device of claim 5, wherein the phase detection module further comprises:
    a phase adjustment module comprising a first input coupled to the first current electrode of the first multi-gate FinFET, a second input coupled to the first current electrode of the second multi-gate FinFET, and an output to proved a third phase indicator signal based on the first phase indicator signal and the second phase indicator signal.

7. The device of claim 1, further comprising:
a phase locked loop comprising a first input coupled to the first current electrode of the first multi-gate FinFET to receive the first phase indicator signal.

8. A method, comprising:
receiving a first phase difference signal at a first gate electrode of a first multi-gate FinFET, the first phase difference signal based on a difference between a phase of a first signal and a phase of a second signal at a first time;
receiving a first bias signal at a second gate electrode of the first multi-gate FinFET, the first bias signal representative of a first phase detection threshold; and
providing a first phase indicator signal at a current electrode of the first multi-gate FinFET based on the first phase difference signal and the first bias signal.

9. The method of claim 8, further comprising:
receiving a second phase difference signal at the first gate electrode of the first multi-gate FinFET, the second phase difference signal based on a difference between a phase of the first signal and a phase of the second signal at a second time; and
providing a second phase indicator signal at the current electrode of the first multi-gate FinFET based on the second phase difference signal and the first bias signal.

10. The method of claim 8, further comprising:
receiving the first phase difference signal at a first gate electrode of a second multi-gate FinFET;
receiving a second bias signal at a second gate electrode of the second multi-gate FinFET, the second bias signal representative of a second phase detection threshold; and
providing a second phase indicator signal at a current electrode of the second multi-gate FinFET based on a second phase difference signal and the second bias signal.

11. The method of claim 10, further comprising:
providing a third phase indicator signal based on the first phase indicator signal and the second phase indicator signal.

12. The method of claim 11, wherein the first phase indicator signal and the second phase indicator signal provide a digital representation of the difference between the phase of the first signal and the phase of the second signal at the first time.

13. The method of claim 11, wherein a magnitude of the third phase indicator signal is based on a level of the first phase indicator signal and a level of the second phase indicator signal.

14. The method of claim 8, further comprising:
receiving a second bias signal at the second gate electrode of the first multi-gate FinFET, the second bias signal representative of a second phase detection threshold; and
providing a second phase indicator signal at the current electrode of the first multi-gate FinFET based on the first phase difference signal and the second bias signal.

15. A device, comprising:
a phase threshold module comprising a first output to provide a first bias signal; and
a first multi-gate FinFET comprising
a first gate electrode coupled to the first output of the phase threshold module,
a second gate electrode coupled to receive a phase difference signal, wherein the phase difference signal is representative of a difference in a phase of a data signal and a phase of a reference signal, and
a current electrode to provide a first phase indicator signal.

16. The device of claim 15, further comprising
a second multi-gate FinFET, comprising
a first gate electrode coupled to receive the data signal,
a second gate electrode coupled to receive the reference signal, and
a current electrode coupled to the second gate electrode of the first multi-gate FinFET.

17. The device of claim 16, further comprising:
a filter coupled to the second gate electrode of the second multi-gate FinFET.

18. The device of claim 15, wherein the phase threshold module further comprises a second output to provide a second bias signal, and further comprising:
a second multi-gate FinFET comprising:
a first gate electrode coupled to the second output of the phase threshold module;
a second gate electrode coupled to receive the phase difference signal, wherein the phase difference signal is representative of a difference in a phase of a data signal and a phase of a reference signal; and
a current electrode coupled to provide a second phase indicator signal.

19. The device of claim 18, further comprising a phase adjustment module, comprising
a first input coupled to the current electrode of the first multi-gate FinFET,
a second input coupled to the current electrode of the second multi-gate FinFET, and
an output to provide a third phase indicator signal to adjust a phase of the data signal, the third phase indicator signal based on the first phase indicator signal and the second phase indicator signal.

20. The device of claim 15, further comprising:
a phase shift keying module comprising an input coupled to the current electrode of the first multi-gate FinFET.

* * * * *

UNITED STATES PATENT AND TRADEMARK OFFICE
CERTIFICATE OF CORRECTION

PATENT NO.        : 7,612,619 B2
APPLICATION NO.   : 11/387595
DATED             : November 3, 2009
INVENTOR(S)       : Mohamed S. Moosa et al.

It is certified that error appears in the above-identified patent and that said Letters Patent is hereby corrected as shown below:

Column 8, Line 65, please change "proved" to --provide--

Signed and Sealed this
First Day of February, 2011

David J. Kappos
*Director of the United States Patent and Trademark Office*